(12) United States Patent
Harvey et al.

(10) Patent No.: US 6,614,181 B1
(45) Date of Patent: Sep. 2, 2003

(54) UV RADIATION SOURCE FOR DENSIFICATION OF CVD CARBON-DOPED SILICON OXIDE FILMS

(75) Inventors: Keith R. Harvey, Los Gatos, CA (US); Tian-Hoe Lim, Santa Clara, CA (US); Li-Qun Xia, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 287 days.

(21) Appl. No.: 09/644,938

(22) Filed: Aug. 23, 2000

(51) Int. Cl.$^7$ .............................. H01K 1/50; H01K 1/52
(52) U.S. Cl. ................... 313/567; 313/362.1; 313/637; 427/595; 250/423 R
(58) Field of Search ..................... 313/567, 637–643, 313/362.1, 568, 570; 427/595, 515, 520; 438/758, 761; 422/24; 250/425–428, 423 R

(56) References Cited

U.S. PATENT DOCUMENTS

| | | | |
|---|---|---|---|
| 3,971,968 A | * 7/1976 | Bachmann et al. | 313/629 |
| 4,945,290 A | * 7/1990 | Eliasson et al. | 313/607 |
| 4,988,533 A | 1/1991 | Freeman et al. | 427/38 |
| 5,194,740 A | * 3/1993 | Kogelschatz et al. | 250/432 R |
| 5,314,724 A | 5/1994 | Tsukune et al. | 427/489 |
| 5,343,114 A | * 8/1994 | Beneking et al. | 313/234 |
| 5,788,778 A | * 8/1998 | Shang et al. | 134/1 |
| 5,970,384 A | 10/1999 | Yamazaki et al. | 438/795 |
| 6,133,694 A | * 10/2000 | Cekic et al. | 313/567 |
| 6,284,050 B1 | * 9/2001 | Shi et al. | 118/715 |

OTHER PUBLICATIONS

"Growth of $YBa_2Cu_3O_7$ in pure ozone irradiated with ultraviolet light", T. Siegrest et al., Appl. Phys. Lett. 60 (20), May 18, 1992, 1992 American Institute of Physics, pp. 2489–2490.

"$UV-O_3$ and Dry–$O_2$: Two–Step Annealed Chemical Vapor–Deposited $Ta_2O_5$ Films for Storage Dielectrics of 64–Mb DRAM's", Hiroshi Shinriki, IEEE Transactions on Electron Devices, vol. 38, No. 3, Mar. 1991, pp. 455–462.

"Critical Process Variables for UV–Ozone Etching of Photoresist", Peter C. Wood et al., Mat. Res. Soc. Symp. Proc. vol. 315, 1993 Materials Research Society, pp. 238–242.

* cited by examiner

*Primary Examiner*—Ashok Patel
*Assistant Examiner*—Sikha Roy
(74) *Attorney, Agent, or Firm*—Townsend and Townsend and Crew

(57) ABSTRACT

A UV radiation source is tunable to optimize the process of densifying a carbon-doped silicon oxide film. The composition and relative concentration of stimulated gases stimulated within an airtight bulb is controlled to produce radiation optimized for absorption by undesirable chemical bonds of the carbon-doped silicon oxide film, leading to disruption of these bonds and their replacement by more desirable stable chemical bonds. The energy of radiation emitted by the source is determined by the identity of excited chemical species, and the intensity of the radiation emitted by the source is determined by the concentration of the excited chemical species. By exciting a specific mixture of gases, radiation is emitted at a combination of energies and intensities calculated to disrupt populations of unstable bonds in the carbon-doped silicon oxide film while leaving desirable bonds in the film unaffected.

6 Claims, 12 Drawing Sheets

UV RADIATION SOURCE FOR DENSIFICATION OF CVD CARBON-DOPED SILICON OXIDE FILMS

BACKGROUND OF THE INVENTION

Silicon oxide ($SiO_2$) finds extremely widespread use in the fabrication of semiconductor devices. Important applications for $SiO_2$ films include providing gate dielectric structures for MOS transistor devices, and providing electrical isolation between electrically conducting metal lines in an integrated circuit.

One approach for forming silicon oxide films on a semiconductor substrate is through the process of chemical vapor deposition (CVD). Specifically, chemical reaction between a silicon supplying material and an oxygen supplying material results in deposition of solid phase silicon oxide on top of a semiconductor substrate.

Organosilane silicon supplying materials including at least one Si—C bond are often utilized during CVD of silicon oxide. As a result of the carbon present in such a silicon supplying material, carbon-doped silicon carbon oxide ($SiC_xO_y$) can be formed, for example, through the following chemical reactions:

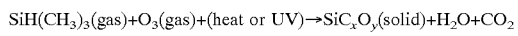

$SiH(CH_3)_3(gas)+O_3(gas)+(heat\ or\ UV) \rightarrow SiC_xO_y(solid)+H_2O+CO_2$

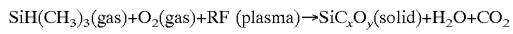

$SiH(CH_3)_3(gas)+O_2(gas)+RF\ (plasma) \rightarrow SiC_xO_y(solid)+H_2O+CO_2$

The reactant species $SiH(CH_3)_3$ is trimethylsilane ("TMS"). Other organosilane compounds include dimethylsilane, diethylsilane, diacetoxyditertiarybutoxysilane, and 2,4,6,8-tetramethyltetrasiloxane.

As a result of CVD chemical reactions involving organosilane process gases, carbon at concentrations of at least about 8 atomic percent and greater may be incorporated into the silicon oxide film. Incorporation of carbon at these quantities into the silicon oxide during deposition has several effects. First, carbon favorably enhances the dielectric properties of the resulting film. Second, the presence of carbon softens the freshly deposited film, rendering the it more sensitive to handling stress.

Water is one by-product of the CVD reaction to form carbon-doped silicon oxide. Water can be incorporated into the deposited film as an Si—OH chemical bond, or physically absorbed into the film as moisture. This Si—OH bond or moisture is not part of stable carbon-doped silicon oxide film, and may later cause failure of dielectric material during device operation.

Accordingly, undesirable chemical bonds such as Si—OH are typically removed from a deposited carbon-doped silicon oxide film through the process of densification. Conventional densification steps subject the deposited carbon-doped silicon oxide film to a high temperature anneal. The energy from this anneal replaces unstable, undesirable chemical bonds with more stable bonds characteristic of an ordered silicon oxide film, increasing the density of the film.

The conventional thermal anneal step is of relatively long duration (approx. 30 min–2 hrs.) This thermal anneal thus consumes significant processing time and slows down the overall fabrication process.

In order to maintain high throughput, thermal annealing steps of long duration are performed in batch-type furnace devices having a high wafer capacity, wherein a large number of wafers are supported by their edges in slots in the walls of the furnace. However, as stated above carbon-doped silicon oxide films are soft and easily damaged by insertion and removal from conventional batch-type furnaces. This prevents wafers coated with the films from being annealed in large quantities.

Therefore, there is a need in the art for a process for densifying CVD carbon-doped silicon oxide films which requires a minimum of water handling and which consumes a minimum of processing time.

It has been suggested to utilize ultraviolet radiation to aid in the densification of CVD silicon oxide films. However, conventional ultraviolet radiation sources typically emit radiation at a single wavelength corresponding to the excited energy state of electrons from a single excited gas species. However, it may be useful to utilize ultraviolet radiation having a plurality of wavelengths.

Therefore, there is a need in the art for a radiation source which simultaneously emits ultraviolet radiation of a combination of different energies and intensities.

SUMMARY OF THE INVENTION

One embodiment of the present invention relates to the use of ultraviolet radiation to anneal and densify a CVD carbon-doped silicon oxide film. Specifically, a freshly deposited carbon-doped silicon oxide film is exposed to ultraviolet radiation calculated to disrupt undesirable chemical bonds, replacing these bonds with more stable bonds characteristic of an ordered silicon oxide film. As a result of this UV radiation exposure, undesirable chemical bonds in the film such as Si—OH are broken, and gas is evolved. This gas is then removed to leave a densified and stable deposited carbon-doped silicon dioxide film.

A first embodiment of an ultraviolet radiation source in accordance with the present invention comprises a first gas supply in fluid communication with an airtight bulb through a first mass flow controller, the first mass flow controller operable to regulate a flow of a first gas into the bulb. A second gas supply is in fluid communication with the bulb through a second mass flow controller, the second mass flow controller operable to regulate a flow of a second gas into the bulb. A pump is operable to evacuate the bulb through an outlet. A filament is disposed within the bulb and in electrical communication with a power supply. Current flowed through the filament causes the first gas and the second gas to become excited and emit ultraviolet radiation having a combination of wavelengths and intensities.

A first embodiment of a method of controlling an energy and an intensity of radiation output from a radiation source comprises the step of electrically stimulating a first gas and a second gas present in an airtight bulb, such that the first gas emits radiation at a first energy and a first intensity, and the second gas emits radiation at a second energy and a second intensity.

These and other embodiments of the present invention, as well as its advantages and features, are described in more detail in conjunction with the text below and attached figures.

DESCRIPTION OF THE SPECIFIC EMBODIMENTS

One embodiment of the present invention relates to the use of ultraviolet radiation to anneal and density carbon-doped silicon oxide films produced by chemical vapor deposition. Specifically, deposited carbon-doped silicon oxide films are exposed to ultraviolet radiation in order to disrupt undesirable chemical bonds (such as Si—OH) present in the deposited material, replacing these undesirable bonds with more stable bonds characteristic of an ordered silicon oxide film (such as Si—O—Si). During this densification process, gases such as water vapor are evolved and removed from the film, resulting in a densified and stable silicon oxide material. Densification by UV radiation exposure is accomplished in only a fraction of the time consumed by a conventional thermal densification processes, avoiding the need for high capacity wafer loading that could damage relatively fragile carbon-doped silicon oxide films.

I. Densification of CVD Oxide Film Utilizing UV Radiation

Figure 1:
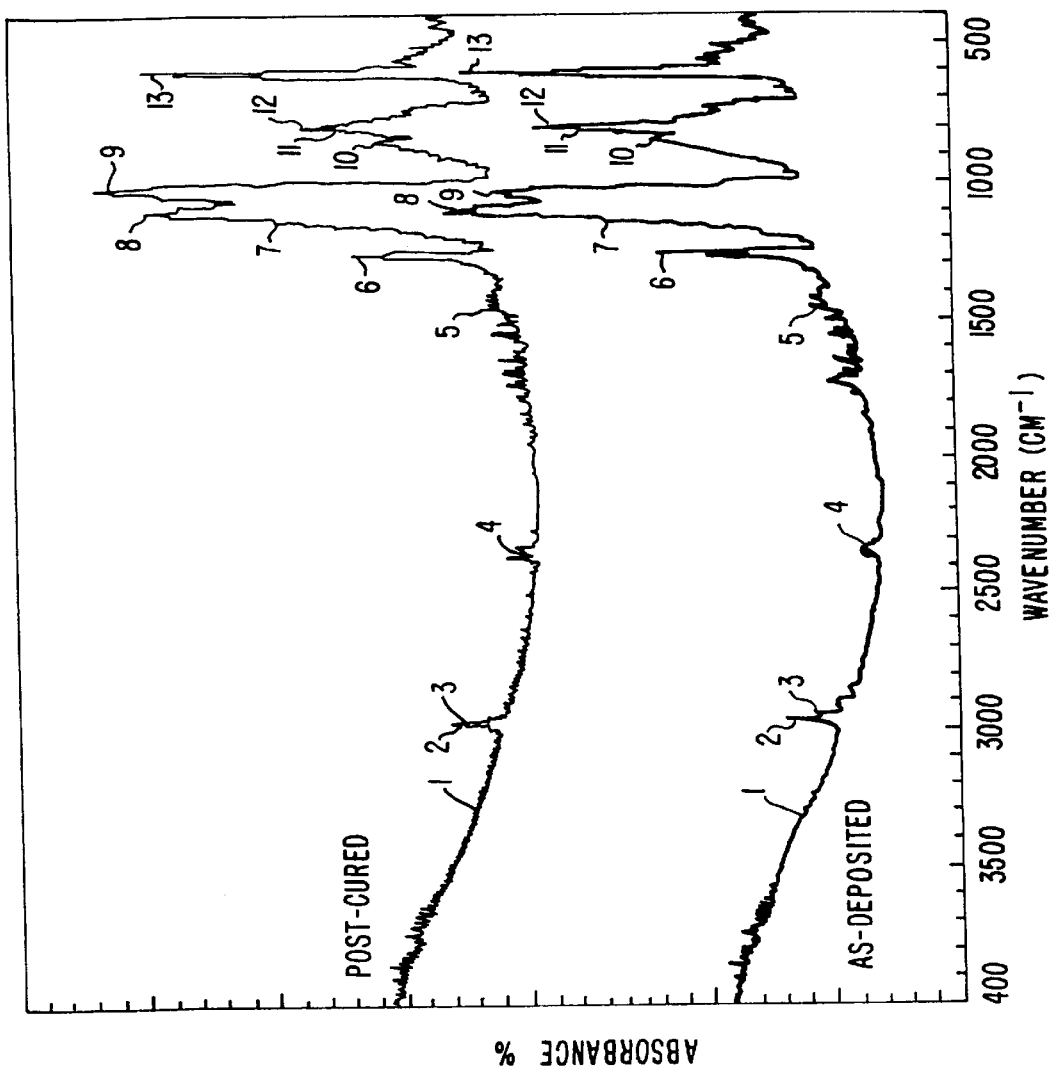
FIG. 1 shows an FTIR spectrum, including peak assignments, for deposited carbon-doped silicon oxide films formed by reaction between TMS and $O_3$, before and after a conventional thermal densification process.

FIG. 1 shows Fourier Transform Infra-Red (FTIR) spectroscopy spectra for freshly-deposited $SiC_xO_y$ films resulting from the reaction between TMS and $O_3$, before and after conventional thermal curing. TABLE 1 summarizes peak assignments for the FTIR spectra of FIG. 1:

TABLE 1

| Peak No. | Wavenumber (cm$^{-1}$) | Bond |
|---|---|---|
| 1 | 3350 | H-OH Stretch |
| 2 | 2965 | $CH_3$ Asymmetric Stretch |
| 3 | 2900 | $CH_3$ Symmetric Stretch |
| 4 | 2350 | C═O |
| 5 | 1430 | Si—$CH_3$ Asymmetric Deformation |

TABLE 1-continued

| Peak No. | Wavenumber (cm$^{-1}$) | Bond |
|---|---|---|
| 6 | 1272 | Si—$CH_3$ Symmetric Deformation |
| 7 | 1164 | Si—O—Si Asymmetric Stretch |
| 8 | 1104 | Cage Si—O—Si Asymmetric Stretch |
| 9 | 1038 | Network Si—O—Si Asymmetric Stretch |
| 10 | 853 | Si—O—Si Symmetric Stretch |
| 11 | 816 | Si—O—Si Symmetric Stretch |
| 12 | 806 | Si—$CH_3$ Rock |
| 13 | 670 | Si—C Asymmetric Stretch |
| 14 | 600 | Si |

Of particular importance is the cage Si—O—Si asymmetric stretch bond peak located at 1104 cm$^{-1}$ (peak 8) and the network Si—O—Si asymmetric stretch bond at 1038 cm$^{-1}$ (peak 9). The cage stretch bond is associated with an unstable, predominately amorphous orientation of the deposited $SiC_xO_y$ film. By network stretch bond is associated with a more stable and ordered the deposited $SiC_xO_y$ film.

FIG. 1 shows that as initially deposited, the peak height and hence population of the cage stretch bond is greater than the peak height and population of the network stretch bond. Following conventional thermal annealing, the relative peak heights and populations are reversed, with the network stretch bond becoming more prevalent than the cage stretch bond. This change in the FTIR spectrum indicates the progress of desirable densification of the deposited oxide film.

It is the goal of a method in accordance with one embodiment of the present invention to accomplish this film densification through application of UV radiation rather than thermal energy.

II. Exemplary CVD/UV Annealing System

Figure 2A:
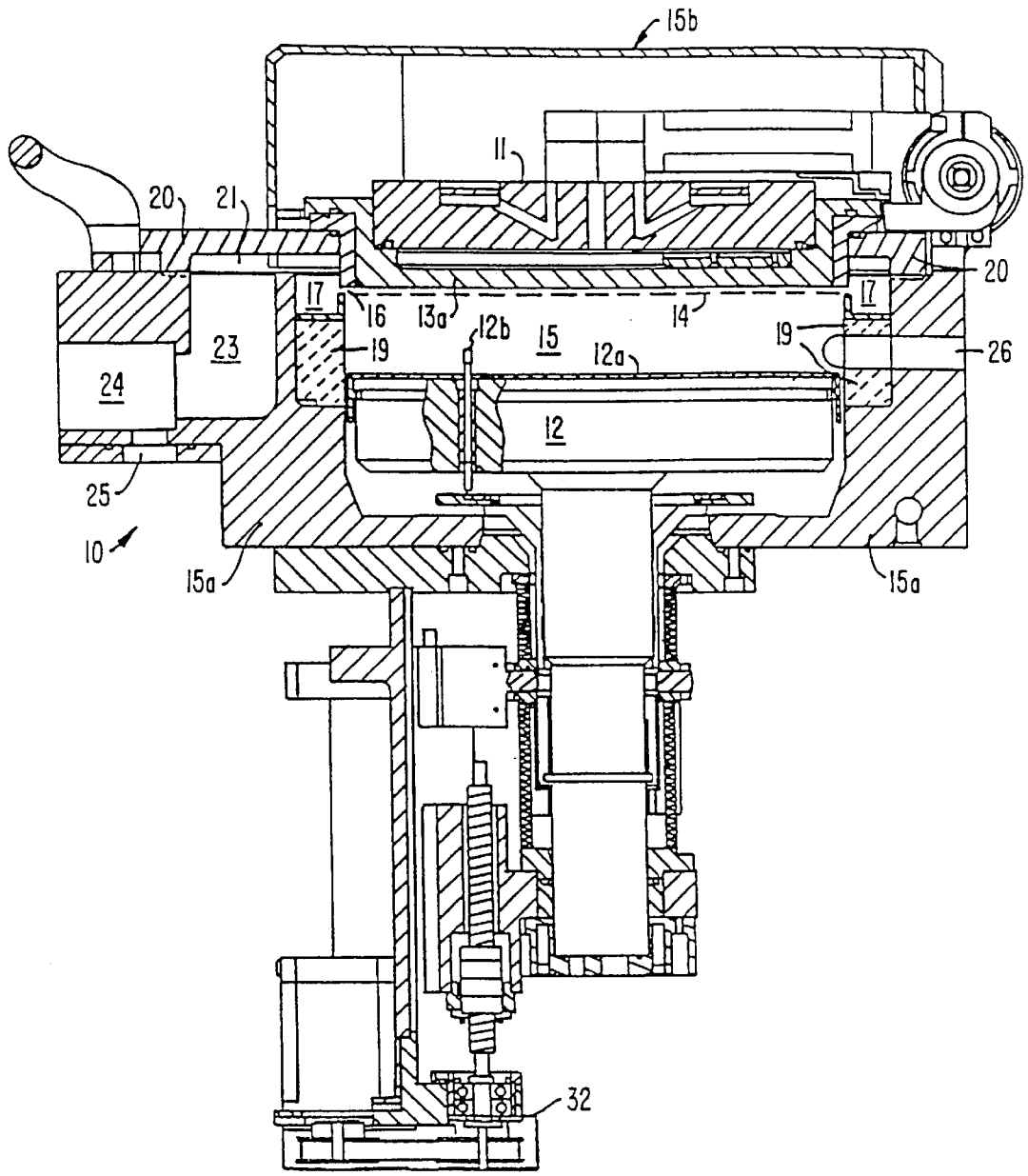
FIGS. 2A and 2B are vertical, cross-sectional views of one embodiment of a chemical vapor deposition apparatus according to the present invention.
Figure 2B:
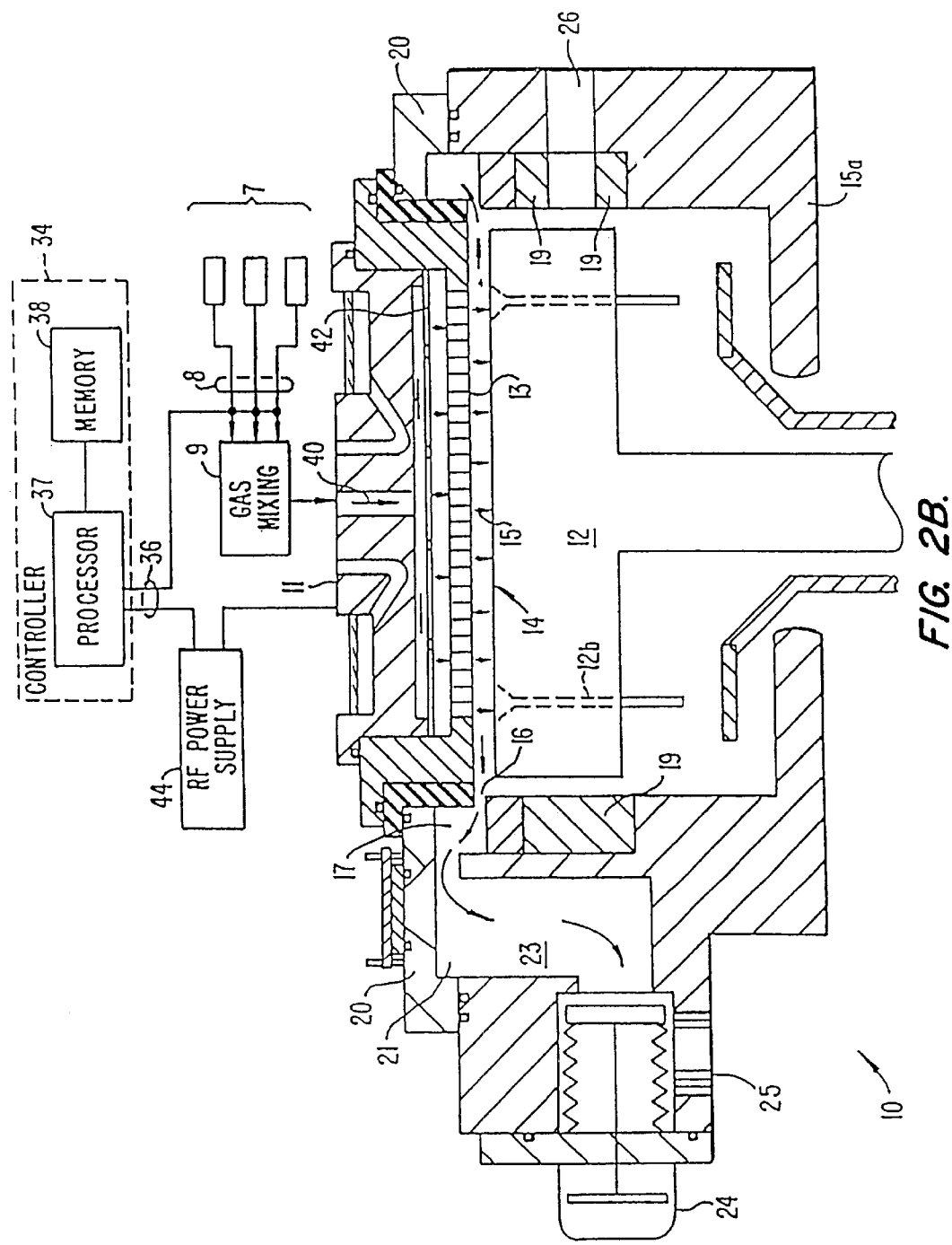
Figure 2C:
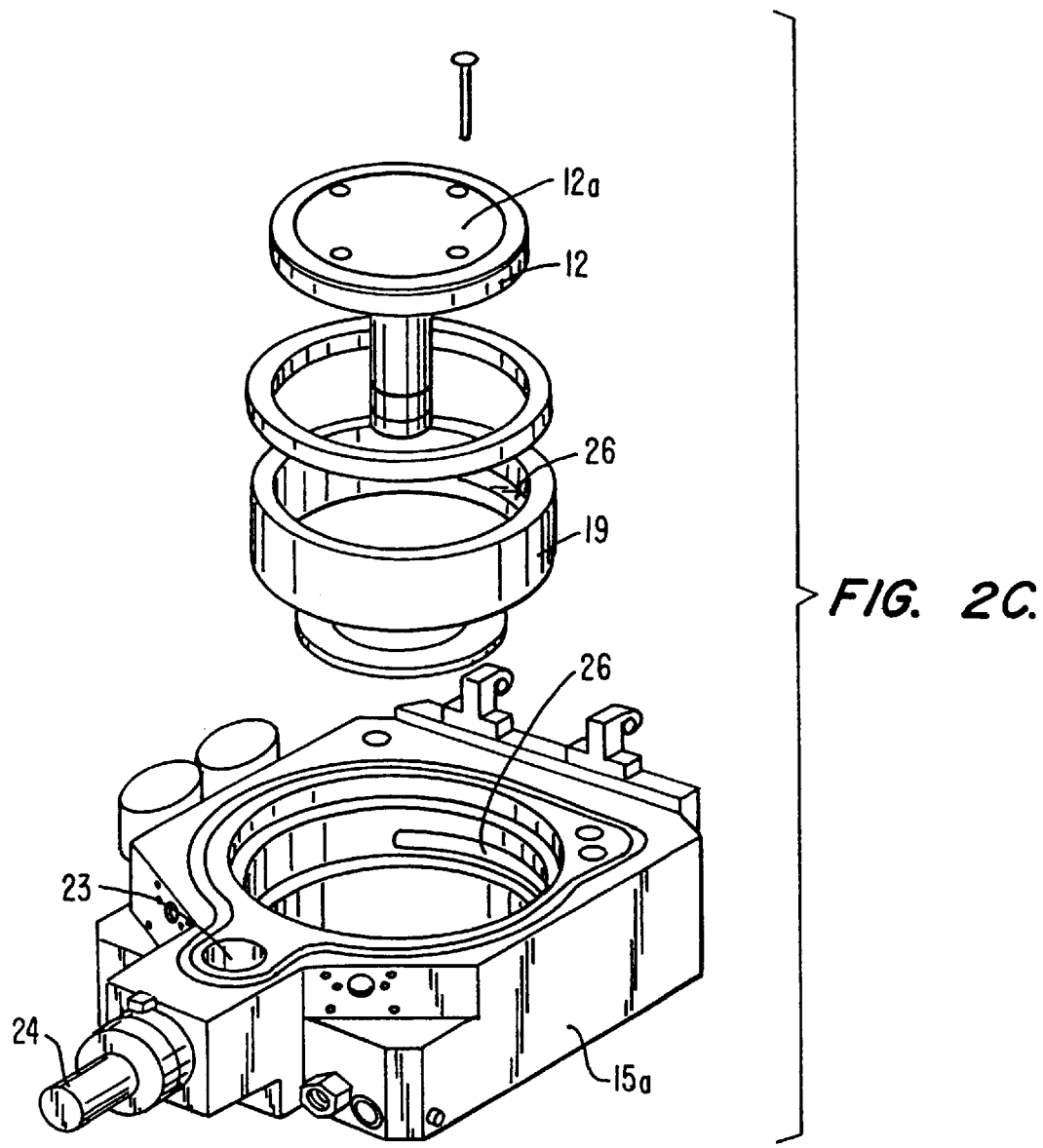
FIGS. 2C and 2D are exploded perspective views of parts of the CVD chamber depicted in FIG. 2A.
Figure 2D:
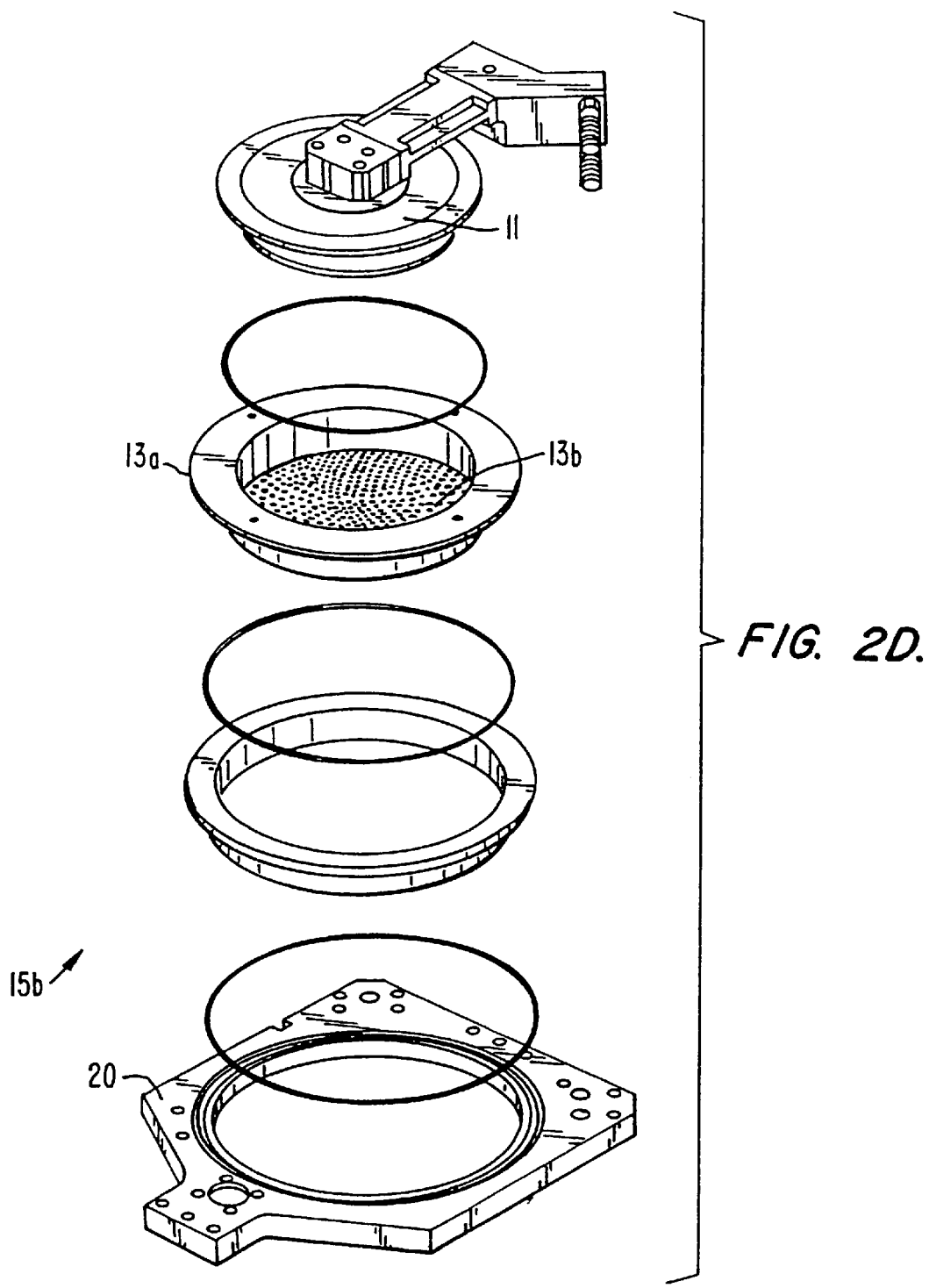

One suitable CVD apparatus in which a carbon doped silicon oxide film can be deposited is shown in FIGS. 2A and 2B. FIGS. 2A and 2B are vertical and cross-sectional views, respectively, of deposition portion 10 of a CVD system having a vacuum or processing chamber 15 that includes a chamber wall 15a and chamber lid assembly 15b. Chamber wall 15a and chamber lid assembly 15b are shown in exploded, perspective views in FIGS. 2C and 2D.

Deposition portion 10 of the CVD system contains a gas distribution manifold 11 for dispersing process gases to a substrate (not shown) that rests on a heated pedestal 12 centered within the process chamber. During processing, the substrate (e.g. a semiconductor wafer) is positioned on a flat (or slightly convex) surface 12a of pedestal 12. The pedestal can be moved controllably between a lower, released loading/off-loading position (depicted in FIG. 2A) and an upper, lifted processing position (indicated by dashed line 14 in FIG. 2A and shown in FIG. 2B), which is closely adjacent to manifold 11. A centerboard (not shown) includes sensors for providing information on the position of the wafers.

Deposition and carrier gases are introduced into chamber 15 through perforated holes 13b (FIG. 2D) of a conventional flat, circular gas distribution or faceplate 13a. More specifically, deposition process gases flow into the chamber through the inlet manifold 11 (indicated by arrow 40 in FIG. 2B), through a conventional perforated blocker plate 42 and then through holes 13b in gas distribution faceplate 13a.

Before reaching the manifold, deposition and carrier gases are input from gas sources 7 through gas supply lines 8 (FIG. 2B) into a mixing system 9 where they are combined and then sent to manifold 11. Generally, the supply line for each process gas includes (i) several safety shut-off valves (not shown) that can be used to automatically or manually shut-off the flow of process gas into the chamber, and (ii) ass flow controllers (also not shown) that measure the flow of gas through the supply line. When toxic gases are used in the process, the several safety shut-off valves are positioned on each gas supply line in conventional configurations.

The deposition process performed in CVD system 10 can be either a thermal process or a plasma-enhanced process. In a plasma-enhanced process, an RF power supply 44 applies electrical power between the gas distribution faceplate 13a and the pedestal so as to excite the process gas mixture to form a plasma within the cylindrical region between the faceplate 13a and the pedestal. (This region will be referred to herein as the "reaction region"). Constituents of the plasma react to deposit a desired film on the surface of the semiconductor wafer supported on pedestal 12. RF power supply 44 is a mixed frequency RF power supply that typically supplies power at a high RF frequency (RF1) of 13.56 MHz and at a low RF frequency (RF2) of 360 KHz to enhance the decomposition of reactive species introduced into the vacuum chamber 15. In a thermal process, RF power supply 44 would not be utilized, and the process gas mixture thermally reacts to deposit the desired films on the surface of the semiconductor wafer supported on pedestal 12, which is resistively heated to provide thermal energy for the reaction.

During a plasma-enhanced deposition process, the plasma heats the entire process chamber 15, including the walls of the chamber body 15a surrounding the exhaust passageway 23 and the shut-off valve 24. When the plasma is not turned on or during a thermal deposition process, a hot liquid is circulated through the walls 15a of the process chamber to maintain the chamber at an elevated temperature. A portion of these heat exchanging passages in the lid of chamber 10 (passages 18) is shown in FIG. 2B. The passages in the remainder of chamber walls 15a are not shown. Fluids used to heat the chamber walls 15a include the typical fluid types, i.e., water-based ethylene glycol or oil-based thermal transfer fluids. This heating (referred to as heating by the "heat exchanger") beneficially reduces or eliminates condensation of undesirable reactant products and improves the elimination of volatile products of the process gases and other contaminants that might contaminate the process if they were to condense on the walls of cool vacuum passages and migrate back into the processing chamber during periods of no gas flow.

The remainder of the gas mixture that is not deposited in a layer, including reaction byproducts, is evacuated from the chamber by a vacuum pump (not shown). Specifically, the gases are exhausted through an annular, slot-shaped orifice 16 surrounding the reaction region and into an annular exhaust plenum 17. The annular slot 16 and the plenum 17 are defined by the gap between the top of the chamber's cylindrical side wall 15a (including the upper dielectric lining 19 on the wall) and the bottom of the circular chamber lid 20. The 360° circular symmetry and uniformity of the slot orifice 16 and the plenum 17 are important to achieving a uniform flow of process gases over the wafer so as to deposit a uniform film on the wafer.

From the exhaust plenum 17, the gases flow underneath a lateral extension portion 21 of the exhaust plenum 17, past a viewing port (not shown), through a downward-extending gas passage 23, past a vacuum shut-off valve 24 (whose body is integrated with the lower chamber wall 15a), and into the exhaust outlet 25 that connects to the external vacuum pump (not shown) through a foreline (also not shown).

The wafer support platter of the pedestal 12 (preferably aluminum, ceramic, or a combination thereof) is resistively-heated using an embedded single-loop embedded heater element configured to make two full turns in the form of parallel concentric circles. An outer portion of the heater element runs adjacent to a perimeter of the support platter, while an inner portion runs on the path of a concentric circle having a smaller radius. The wiring to the heater element passes through the stem of the pedestal 12.

Typically, any or all of the chamber lining, gas inlet manifold faceplate, and various other reactor hardware are made out of material such as aluminum, anodized aluminum, or ceramic. An example of such a CVD apparatus is described in U.S. Pat. No. 5,558,717 entitled "CVD Processing Chamber," issued to Zhao et al. The U.S. Pat. No. 5,558,717 patent is assigned to Applied Materials, Inc., the assignee of the present invention, and is hereby incorporated by reference in its entirety.

A lift mechanism and motor 32 (FIG. 2A) raises and lowers the heater pedestal assembly 12 and its wafer lift pins 12b as wafers are transferred into and out of the body of the chamber by a robot blade (not shown) through an insertion/removal opening 26 in the side of the chamber 10. The motor 32 raises and lowers pedestal 12 between a lifted processing position 14 and a lower, released wafer-loading position.

Figure 3:
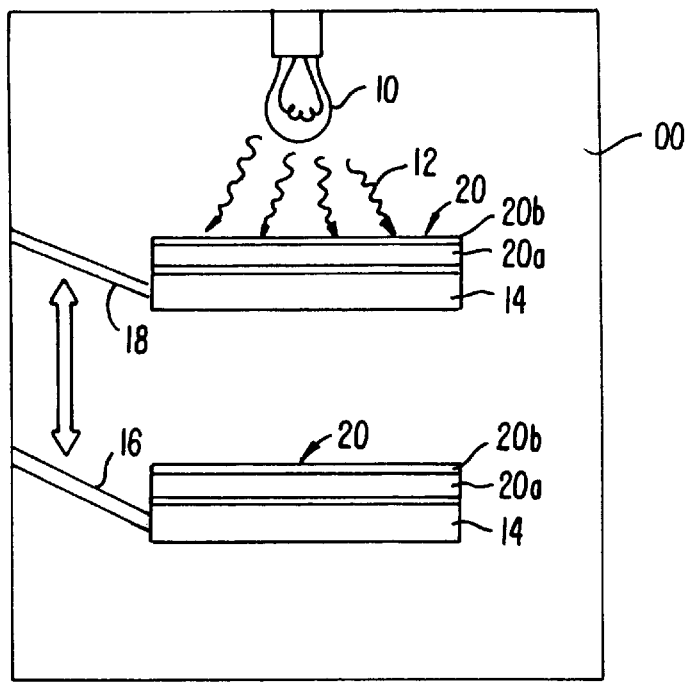
FIG. 3 shows a UV exposure chamber in which a coated wafer may be moved between a released and a lifted position.

Once the carbon-doped silicon oxide material has been deposited on the wafer by the apparatus described above, the film is densified by exposure to ultraviolet radiation in accordance with one embodiment of the present invention. FIG. 3 shows a UV exposure chamber into which a wafer bearing a freshly-deposited CVD SiCO film may be loaded for exposure to UV radiation. UV exposure chamber 300 includes UV radiation source 310 emitting u radiation 312. NV exposure chamber 300 also includes substrate support 314 moveable between a released position 316 distal from UV source 310, and a lifted position 318 proximate to UV source 310.

Substrate support 314 supports wafer 320 including a substrate 320a and a SiCO coating 320b resulting from the reaction of TMS and $O_3$. During insertion and removal of wafer 320 from chamber 300, substrate support 314 is in the released position 316. During ordinary exposure of coated wafer 320 to UV radiation 312, substrate support 314 is raised into the lifted position 318 in order to maximize radiation exposure.

The deposition chamber of FIG. 2A and the UV exposure chamber of FIG. 3 may together comprise an integrated, multi-chamber CVD processing system served by a single robot arm. The UV radiation source and substrate support of the exposure chamber, and the wafer support, motor, valves or flow controllers connected to the supply lines 8, gas delivery system, throttle valve, RF power supply 44, and chamber and substrate heating systems, as well as the robot arm, may all be controlled by a system controller 34 (FIG. 2B) over control lines 36, of which only some are shown. Controller 34 relies on feedback from optical sensors to determine the position of movable mechanical assemblies such as the throttle valve and susceptor which are moved by appropriate motors under the control of controller 34.

In a preferred embodiment, the system controller includes a hard disk drive (memory 38), a floppy disk drive and a processor 37. The processor contains a single-board computer (SBC), analog and digital input/output boards, interface boards and stepper motor controller boards. Various parts of CVD system conform to the Versa Modular European (VME) standard which defines board, card cage, and connector dimensions and types. The VME standard also defines the bus structure as having a 16-bit data bus and a 24-bit address bus.

System controller 34 controls all of the activities of the CVD system. The system controller executes system control software, which is a computer program stored in a computer-readable medium such as a memory 38. Preferably, memory 38 is a hard disk drive, but memory 38 may also be other kinds of memory. The computer program includes sets of instructions that dictate the timing, mixture of gases, chamber pressure, chamber temperature, RF power levels, susceptor position, radiation exposure time, and other parameters of a particular process. Other computer programs stored on other memory devices including, for example, a floppy disk or other another appropriate drive, may also be used to operate controller 34.

Figure 4:
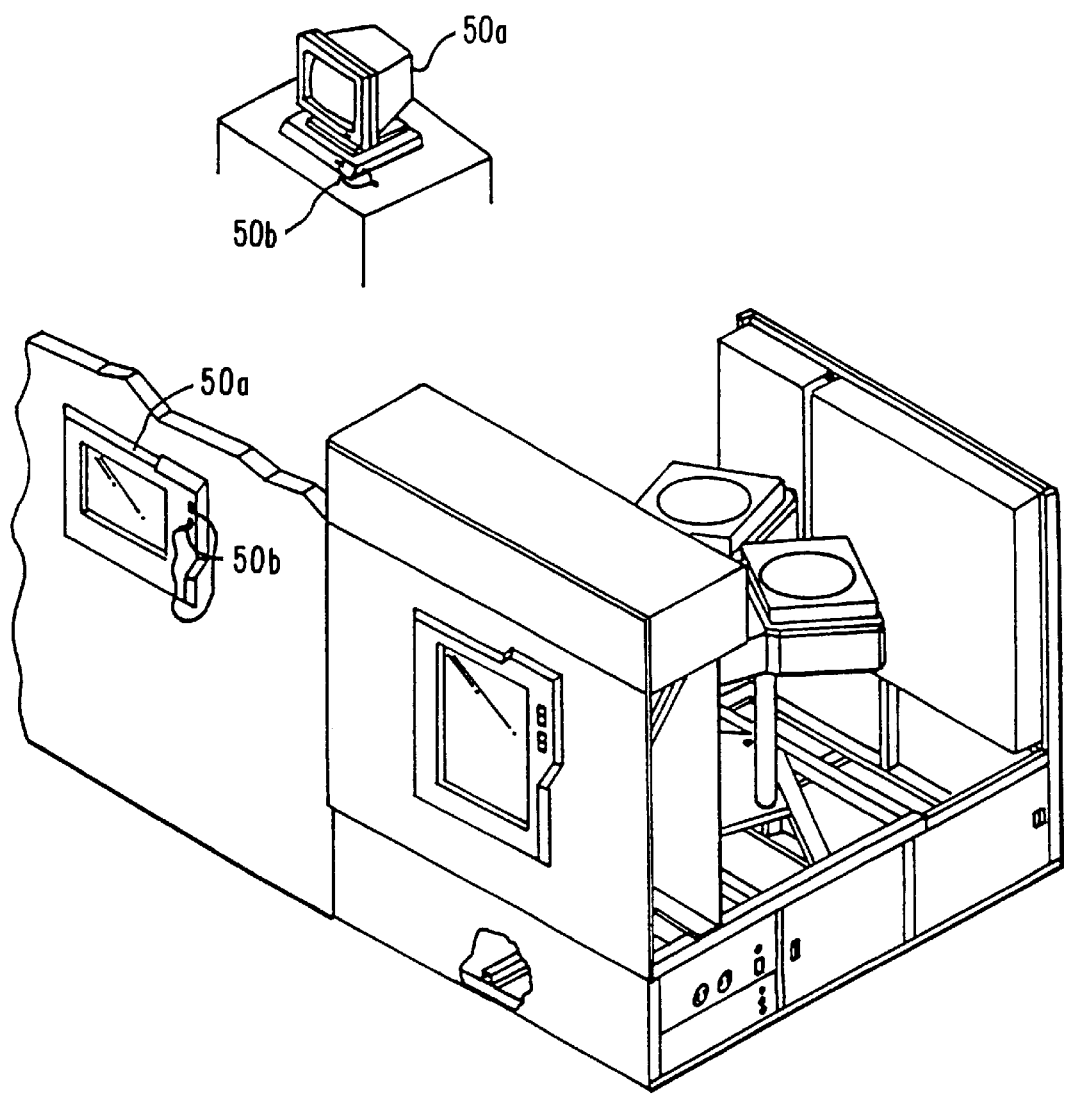
FIG. 4 is a simplified diagram of a system monitor and a multi-chamber CVD system.

The interface between a user and controller 34 is via a CRT monitor 50a and light pen 50b, shown in FIG. 4, which is a simplified diagram of the system monitor and multi-chamber CVD substrate processing system. In the preferred embodiment two monitors 50a are used, one mounted in the clean room wall for the operators and the other behind the wall for the service technicians. The monitors 50a simultaneously display the same information, but only one light pen 50b is enabled. A light sensor in the tip of light pen 50b detects light emitted by CRT display. To select a particular screen or function, the operator touches a designated area of the display screen and pushes the button on the pen 50b. The touched area changes its highlighted color, or a new menu or screen is displayed, confirming communication between the light pen and the display screen. Other devices, such as a keyboard, mouse, or other pointing or communication device, may be used instead of or in addition to light pen 50b to allow the user to communicate with controller 34.

The process for depositing the film can be implemented using a computer program product that is executed by controller 34. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 5:
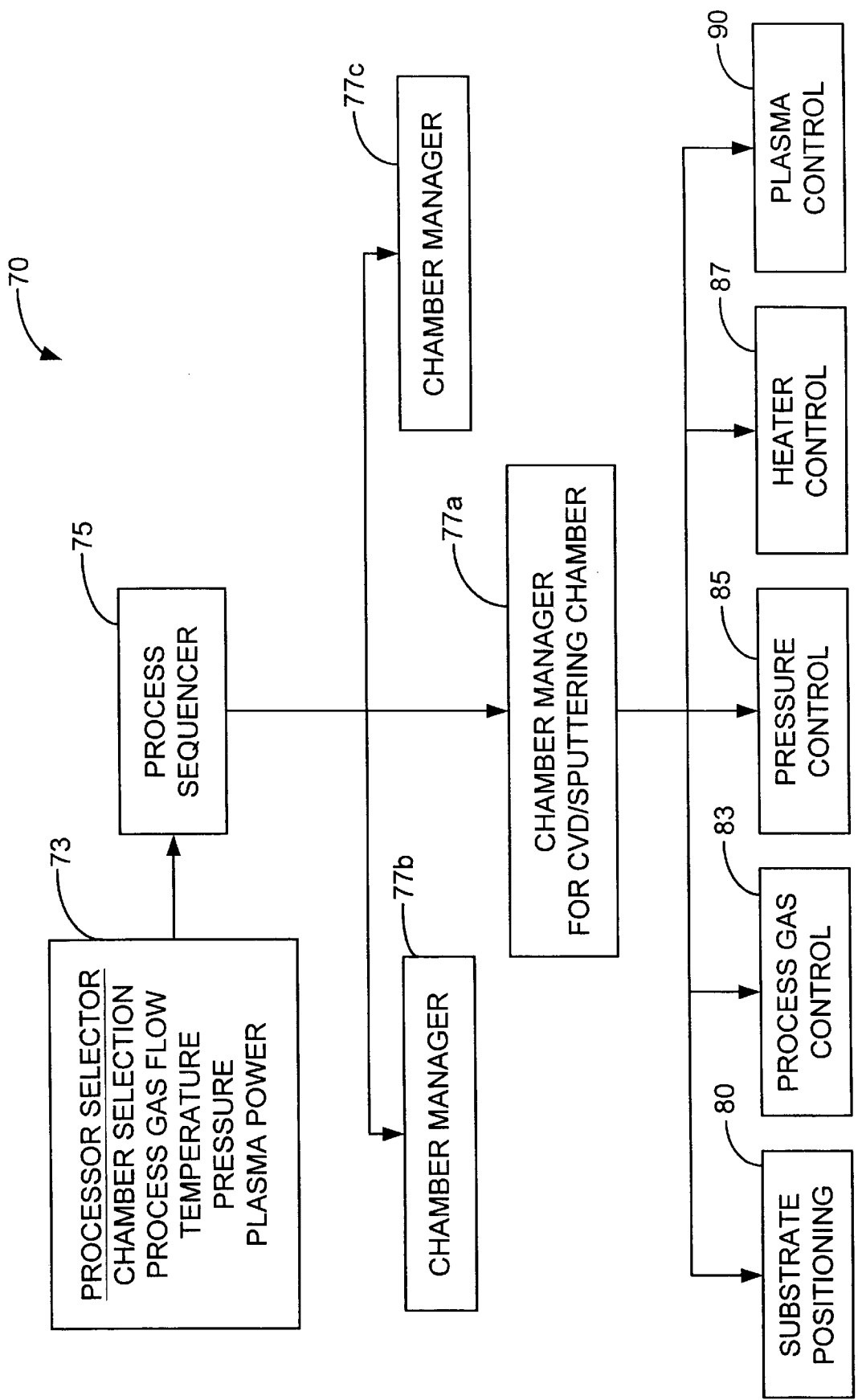
FIG. 5 shows an illustrative block diagram of the hierarchical control structure of the system control software according to a specific embodiment.

FIG. 5 is an illustrative block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface.

The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the sequencer subroutine 75 initiates execution of the process set by passing the particular process set parameters to a chamber manager subroutine 77a–c, which controls multiple processing tasks in a process chamber 15 according to the process set determined by the sequencer subroutine 75. For example, the chamber manager subroutine 77a comprises program code for controlling sputtering and CVD process operations in the process chamber 15. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87, and plasma control subroutine 90. Those having ordinary skill in the art will readily recognize that other chamber control subroutines can be included depending on what processes are to be performed in the process chamber 15. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 15 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIG. 5. The substrate positioning subroutine 80 comprises program code for controlling chamber components that are used to load the substrate onto pedestal 12 and, optionally, to lift the substrate to a desired height in the chamber 15 to control the spacing between the substrate and the gas distribution manifold 11. When a substrate is loaded into the process chamber 15, pedestal 12 is lowered to receive the substrate, and thereafter, the susceptor 12 is raised to the desired height in the chamber, to maintain the substrate at a first distance or spacing from the gas distribution manifold during the CVD process. In operation, the substrate positioning subroutine 80 controls movement of pedestal 12 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 15 to stabilize the pressure in the chamber before reactive process gases are introduced. For these processes, the process gas control subroutine 83 is programmed to include steps for flowing the inert gas into the chamber 15 for an amount of time necessary to stabilize the pressure in the chamber, and then the steps described above would be carried out. Additionally, when a process gas is to be vaporized from a liquid precursor, for example, TEOS, the process gas control subroutine 83 is written to include steps for bubbling a delivery gas, such as helium, through the liquid precursor in a bubbler assembly or introducing a carrier gas, such as helium or nitrogen, to a liquid injection system.

The pressure control subroutine 85 comprises program code for controlling the pressure in the chamber 15 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 15 by reading one or more conventional pressure manometers connected to the chamber, to compare the measure value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 15 to the desired pressure.

The heater control subroutine 87 comprises program code for controlling the current to a heating unit that is used to heat the substrate 20. The heater control subroutine 87 is also invoked by the chamber manager subroutine 77a and receives a target, or set-point, temperature parameter. The heater control subroutine 87 measures the temperature by measuring voltage output of a thermocouple located in pedestal 12, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat pedestal 12, the heater control subroutine 87 gradually controls a ramp up/down of current applied to the loop. Additionally, a built-in fail-safe mode can be included to detect process safety compliance, and can shut down operation of the heating unit if the process chamber 15 is not properly set up.

The plasma control subroutine 90 comprises program code for setting the low and high frequency RF power levels applied to the process electrodes in the chamber 15 and for setting the low frequency RF frequency employed. Similar to the previously described chamber component subroutines, the plasma control subroutine 90 is invoked by the chamber manager subroutine 77a.

The above reactor description is mainly for illustrative purposes, and other thermal CVD equipment such as the Giga-fill chamber manufactured by Applied Materials may be employed. Additionally, variations of the above-described system, such as variations in pedestal design, heater design, RF power frequencies, location of RF power connections and others are possible. For example, the wafer could be supported by a susceptor and heated by quartz lamps. The layer and method for forming such a layer of the present invention is not limited to any specific apparatus or to any specific plasma excitation method.

III. UV Annealing Method

Figure 6:
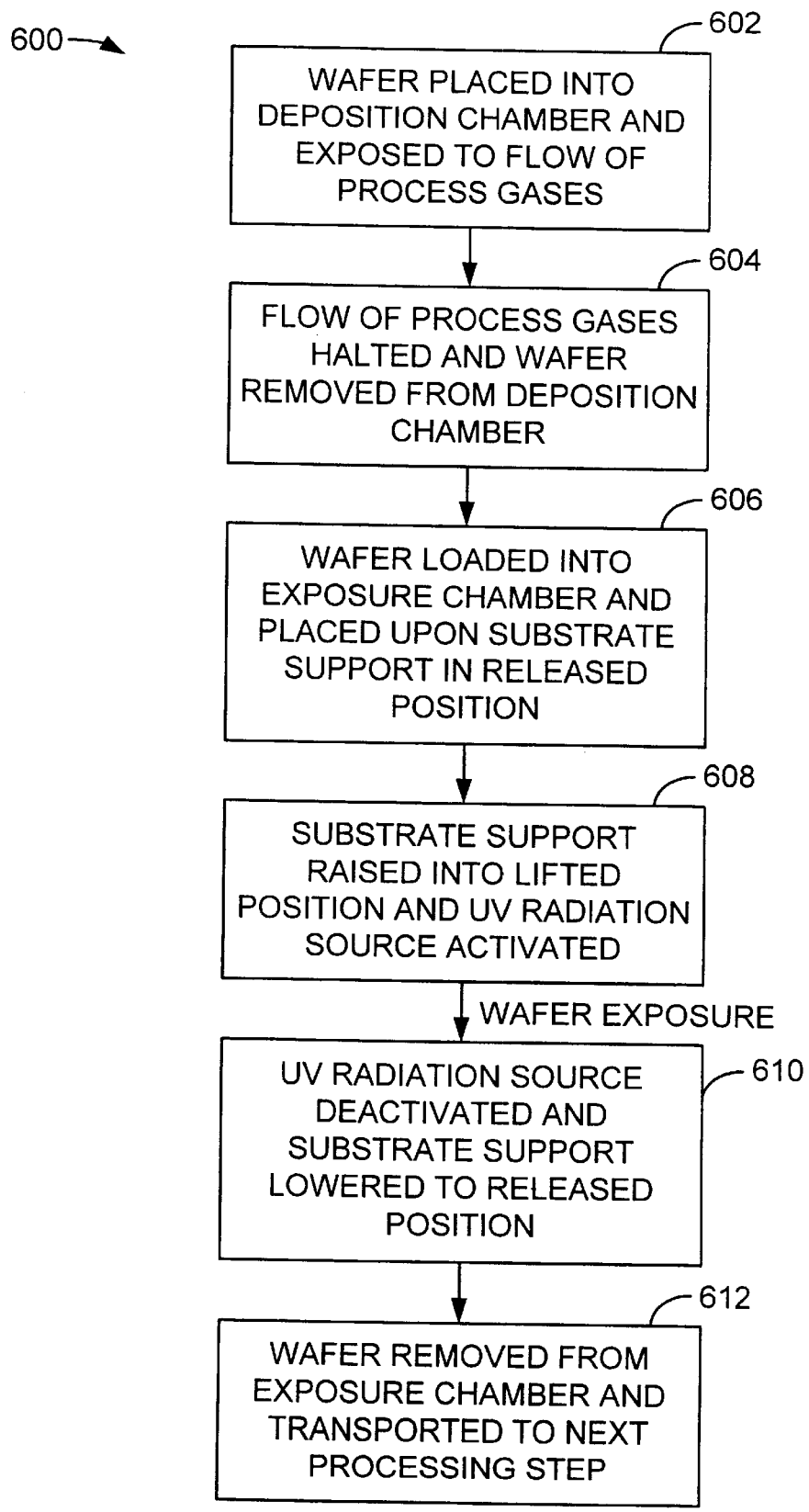
FIG. 6 shows a flow chart of the steps involved in one embodiment of a method for depositing carbon doped silicon oxide in accordance with the present invention.

As described above, one embodiment of the method in accordance with the present invention calls for exposing a deposited $SiC_xO_y$ film to ultraviolet radiation. FIG. 6 shows a flow chart of the steps involved in such a method 600.

As shown in step 602, a semiconductor wafer is first placed into a deposition chamber and exposed to a flow of process gases, such that these process gases react to form solid carbon doped silicon oxide material on the wafer surface. This deposition reaction may be assisted by the presence of plasma in the processing chamber.

In step 604, the flow of process gases is then halted, and coated semiconductor wafer is removed from the deposition chamber. The coated semiconductor wafer is then inserted into the UV exposure chamber and placed upon the substrate support in the released position.

In step 606, the substrate support of the UV exposure chamber is raised into the lifted position, and the UV radiation source is activated.

After a brief period of radiation exposure, step 610 shows that the UV radiation source is deactivated and the substrate support lowered back into the released position. In step 612, the wafer bearing the now-densified carbon doped silicon oxide layer is removed from the exposure chamber and transported to the next applicable processing step.

A wafer bearing a CVD SiCO film may be exposed ultraviolet radiation having different energies and intensities. For example, when electrically stimulated, Xe gas gives off radiation at a wavelength of 172 nm. One source of such radiation is the Xe-filled Zeridex™ UV lamp. A non-exclusive list of gases which may be employed for densification, together with the corresponding wavelengths of radiation emitted, is as follows:

| Excited Gas Species | Emitted Radiation Wavelength (nm) |
|---|---|
| Xe | 172 |
| Hg | 243 |
| Deuterium | 140 |
| $KrCl_2$ | 222 |

Figure 7:
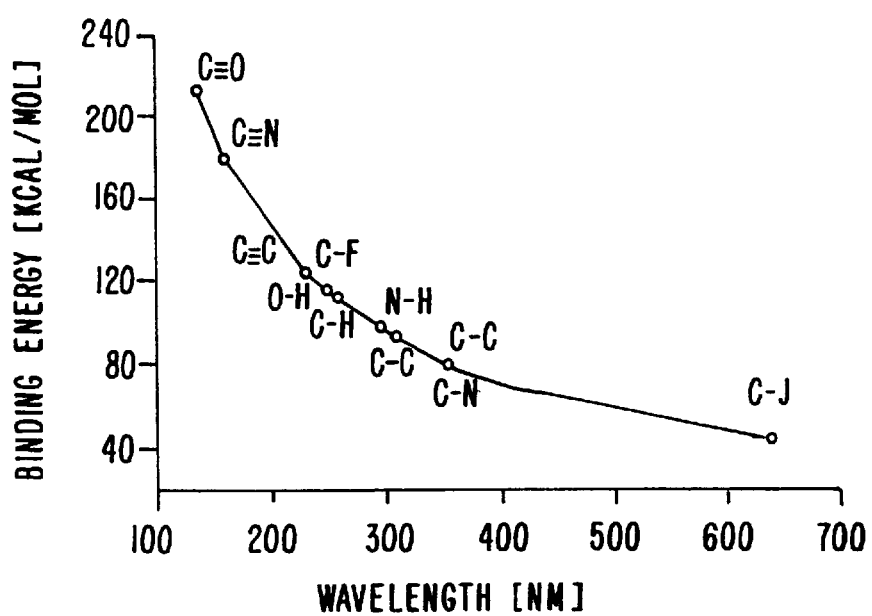
FIG. 7 plots binding energy versus wavelength of absorbed radiation wavelength for a variety of common chemical bonds.

FIG. 7 plots binding energy versus wavelength for a number of common chemical bonds. Exposure of the deposited film to UV radiation in accordance with the present invention intended to disrupt certain undesirable bonds formed in the deposited film. For example, the unwanted Si—OH bond absorbs radiation at approximately 200 nm. Thus, FIG. 7 can be used in conjunction with the above-listed excitable gas species in order to determine the necessary applied wavelength of radiation.

IV. Experimental Results

Figure 8:
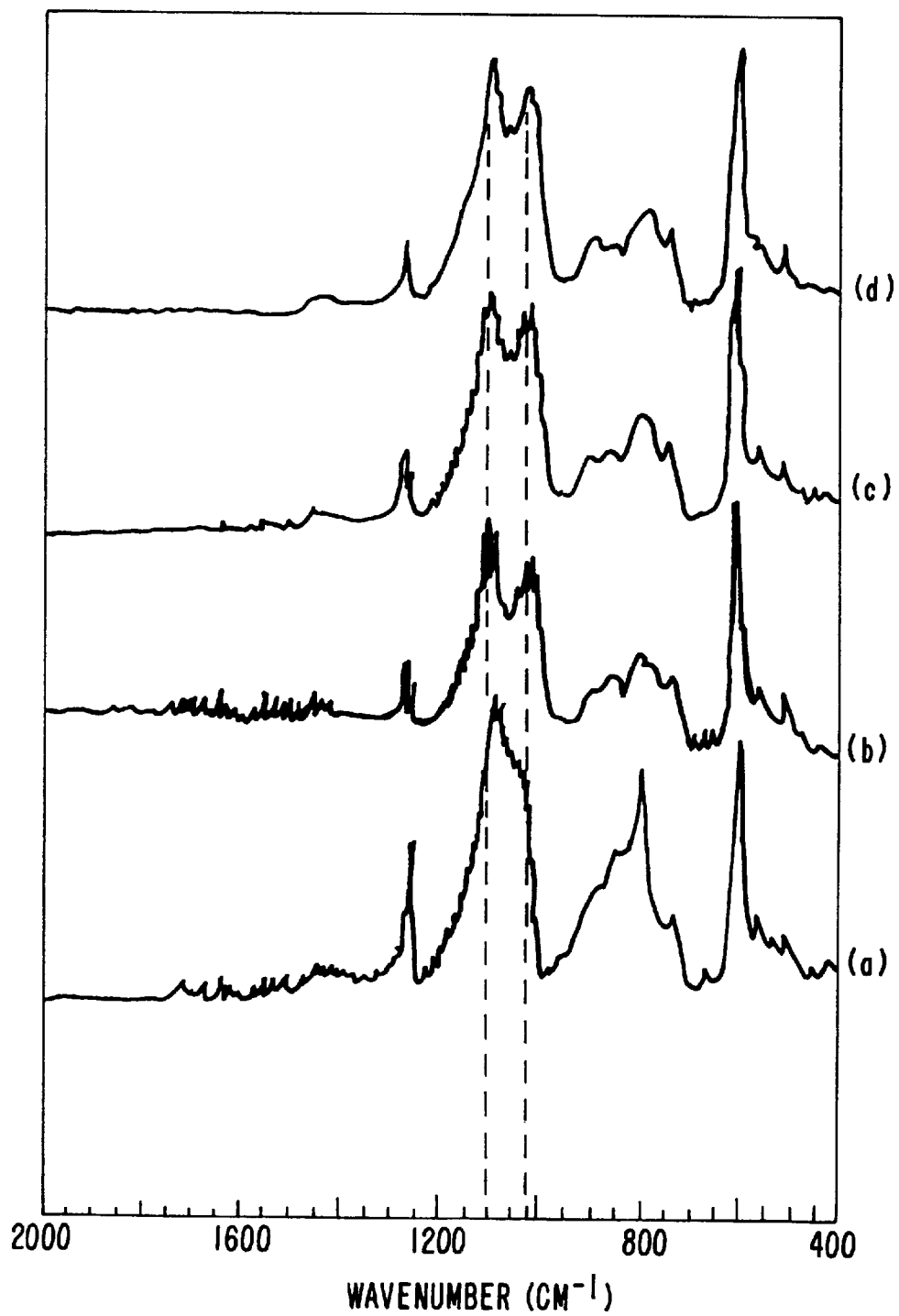
FIG. 8 compares FTIR spectra of a variety of deposited carbon-doped silicon oxide films formed by the reaction between TMS and $O_3$.

FIG. 8 compares FTIR spectra of a variety of films formed under conditions specified below in TABLE 2.

TABLE 2

| FT-IR Spectrum No. | Deposition Conditions | Post-Deposition Conditions | Notes |
|---|---|---|---|
| 8(a) | T = 125° C.<br>P = 100 Torr<br>$S_p$ = 210 mils<br>$[O_3]$ = 15.75 wt %<br>$O_3$ flow = 5000 sccm<br>He flow = 8000 sccm<br>TMS flow = 750 sccm | None | No film densification |
| 8(b) | T = 125° C.<br>P = 100 Torr<br>$S_p$ = 210 mils<br>$[O_3]$ = 15.75 wt %<br>$O_3$ flow = 5000 sccm<br>He flow = 8000 sccm<br>TMS flow = 750 sccm | T = 400° C.<br>Time = 10 min | film densification by conventional thermal annealing |
| 8(c) | T = 125° C.<br>P = 100 Torr<br>$S_p$ = 210 mils<br>$[O_3]$ = 15.75 wt %<br>$O_3$ flow = 5000 sccm<br>He flow = 8000 sccm<br>TMS flow = 750 sccm | T = 25° C.<br>UV = 172 nm<br>Time = 2 min | film densification by UV irradiation with wafer support in released position |
| 8(d) | T = 125° C.<br>P = 100 Torr<br>$S_p$ = 210 mils<br>$[O_3]$ = 15.75 wt %<br>$O_3$ flow = 5000 sccm<br>He flow = 8000 sccm<br>TMS flow = 750 sccm | T = 25<br>UV = 172 nm<br>Time = 2 min | film densification by UV irradiation with wafer support in lifted position |

FIG. 8 shows that the freshly deposited $SiC_xO_y$ film of spectrum 8(a) exhibits a broad peak in the region around 1100 $cm^{-1}$. FIG. 8 also shows that after conventional thermal annealing, this broad peak resolves into the two distinct peaks at 1104 $cm^{-1}$ and 1038 $cm^{-1}$ of spectrum 8(b), corresponding to cage and network asymmetric Si—O—Si stretching bonds respectively. This reveals that the annealed film is more stable than the freshly-deposited film.

FIG. 8 further shows that upon brief exposure to UV radiation in the released position, the broad peak at 1100 $cm^{-1}$ of the freshly deposited film of spectrum 8(a) is also resolved in spectrum 8(c) into distinct peaks at 1104 $cm^{-1}$ and 1038 $cm^{-1}$, corresponding to cage and network asymmetric stretching bonds, respectively. The same is true for films briefly exposed to UV radiation in the lifted position as shown in spectrum 8(d). Moreover, the peak height of the thermally-annealed film of spectrum 8(b) is approximately the same as the UV-exposed film of spectra 8(c) and 8(d), indicating film densification by UV exposure in accordance with one embodiment of the present invention is as effective as a conventional thermal anneal densification process.

Figure 9A:
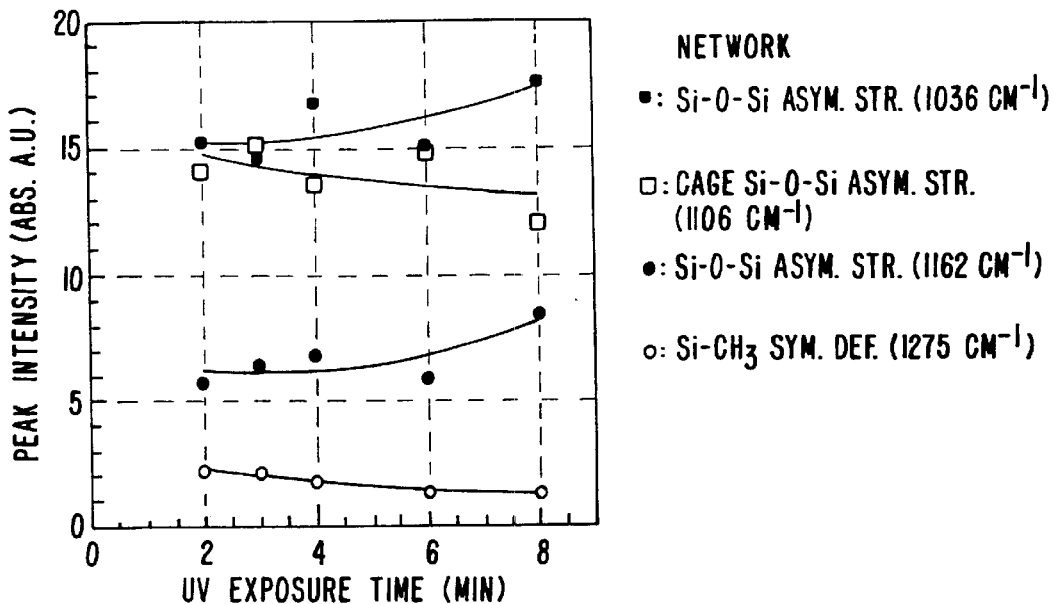
FIGS. 9A and 9B plot FTIR peak intensity versus UV exposure time for carbon-doped silicon oxide films formed by reaction between TMS and $O_3$ and densified using UV radiation in accordance with one embodiment of the present invention.
Figure 9B:
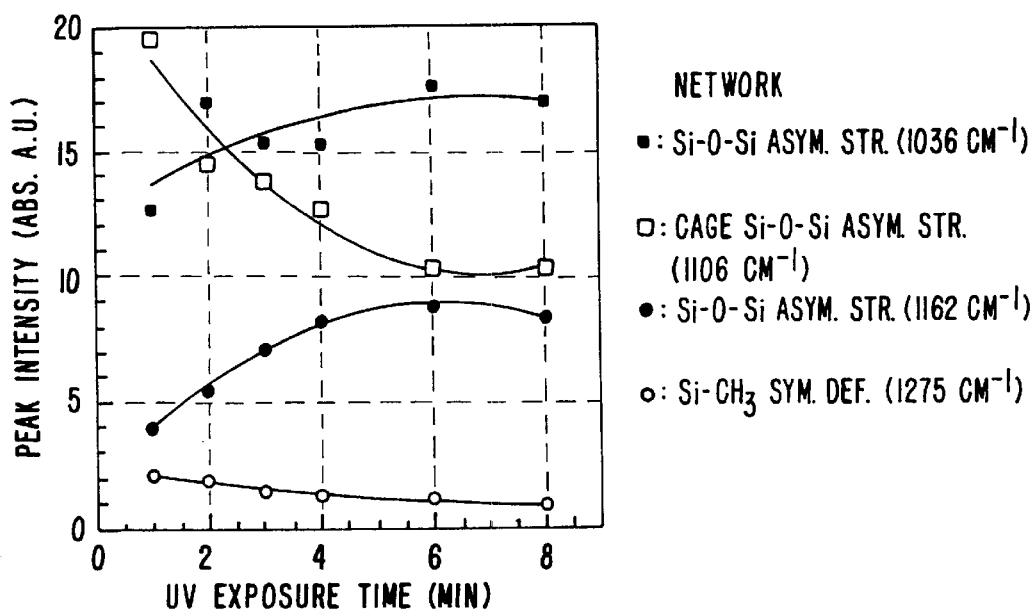

FIGS. 9A and 9B plot peak intensity versus UV exposure time for FTIR spectra of SiCO films produced by the reaction between TMS and $O_3$ and densified utilizing UV radiation in accordance with one embodiment of a method of the present invention. FIG. 9A plots the change in peak intensity of a wafer irradiated in the released position. FIG. 9B plots the change in peak intensity of a wafer irradiated in the lifted position.

In both FIGS. 9A and 9B, the peak intensity of the network Si—O—Si asymmetric stretching bonds increased, while the peak intensity of the cage Si—O—Si asymmetric stretching bonds decreased. In the lifted position represented in FIG. 9B, this change was enhanced due to the increased proximity of the wafer to the UV radiation source.

FIGS. 9A and 9B also show that the height of the Si—O—Si asymmetric stretching bond peak at 1162 $cm^{-1}$ increased, further indicating film densification. The peak height of the Si—$CH_3$ symmetric deformation bond decreased slightly, indicating film densification leading to thickness reduction.

Figure 10:
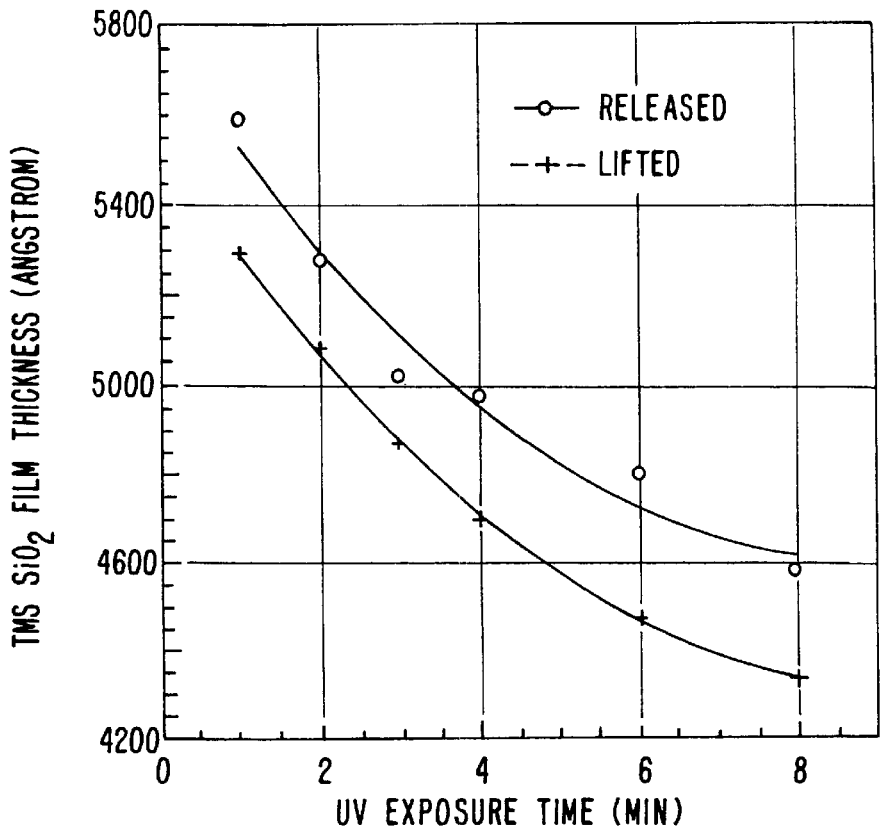
FIG. 10 plots film thickness versus UV exposure time for wafers placed in released and lifted positions.

FIG. 10 plots deposited film thickness versus UV exposure time for wafers placed in the released and in the lifted position. FIG. 10 shows that over time, the thickness of the SiCO film decreased, revealing progress in the densification process and replacement of unstable bonds with stable bonds. Densification was more pronounced in the lifted position due to the closer proximity of the CVD film to the UV source, and the correspondingly greater intensity of UV radiation exposure.

V. UV Radiation Source Having Tunable Output

While exposure to radiation of a uniform energy and intensity from a UV source as described above is adequate to densify a CVD carbon doped silicon oxide film, it may be desirable to utilize a UV radiation source having an output more specifically adapted to the process of film densification.

Figure 11:
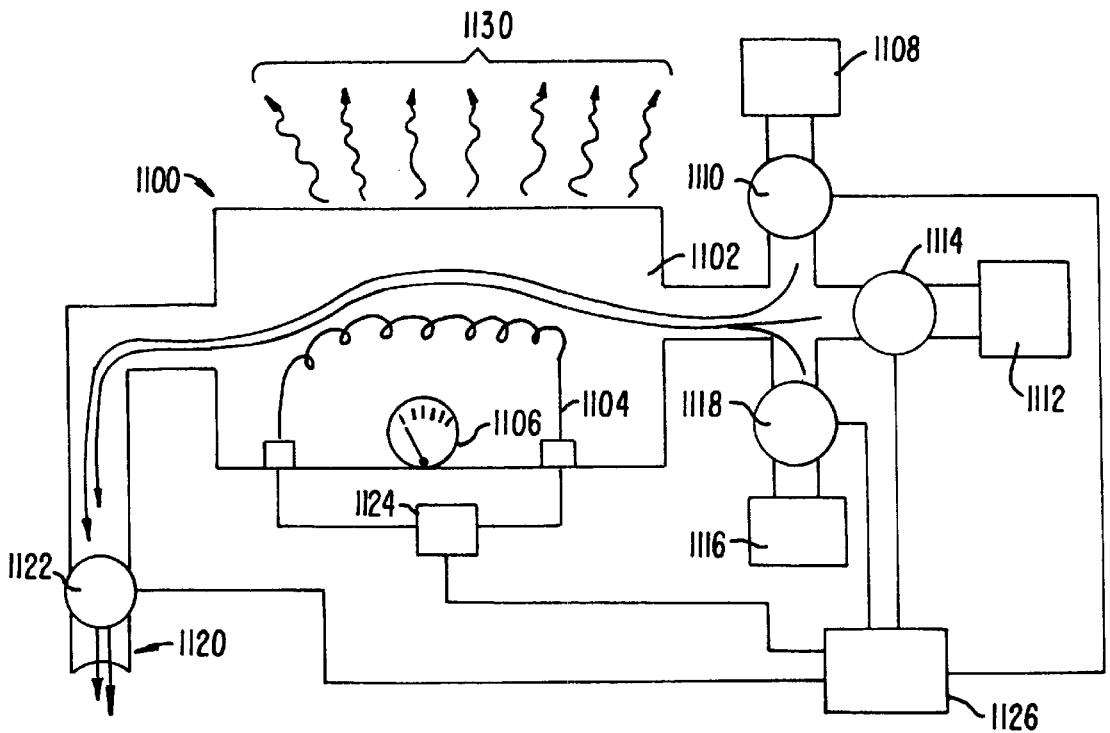
FIG. 11 shows one embodiment of a UV radiation source in accordance with the present invention.

Accordingly, FIG. 11 shows an embodiment of a UV radiation source in accordance with one embodiment of the present invention. UV source 1100 includes airtight bulb 1102 including filament 1104 and pressure gauge 1106.

Bulb 1102 is in fluid communication with first gas source 1108 through first mass flow controller 1110. Bulb 1102 is in fluid communication with second gas source 1112 through second mass flow controller 1114. Bulb 1102 is in fluid communication with third gas source 1116 through third mass flow controller 1118.

Bulb 1102 is in communication with outlet 1120 through vacuum pump 1122. Filament 1104 is in electrical communication with power supply 1124.

First mass flow controller 1110, second mass flow controller 1114, third mass flow controller 1118, vacuum pump 1122, and power supply 1124 are each linked to and controlled by controller 1126.

During operation of UV source 1100, bulb 1102 is evacuated by pump 1122, and mass flow controllers 1118, 1114 and/or 1118 are manipulated to permit a gas or gas mixture to flow into bulb 1102. Once a desired gas or gas mixture is present within bulb 1102, power supply 1124 supplies current to filament 1104. This applied current excites electrons of the gas molecules present in bulb 1102, stimulating these electrons into higher energy states. UV radiation 1130 is emitted from the gas molecules as these excited electrons relax back into their normal energy states.

The energy of UV radiation emitted during this excitation/relaxation cycle depends solely upon the energy difference between normal and excited electron states of the excited gas species. Hence the identity of the excited gas species determines the wavelength/energy of the emitted radiation, while the concentration of the excited gas species in the mixture determines the intensity of emitted radiation. By controlling the composition and relative concentration of the components of an excited gas mixture within the bulb, the energy and intensity of radiation emitted by the UV source can be controlled.

Exercising control over the quality (energy/wavelength) and quantity (intensity) of emitted UV radiation during the silicon oxide densification process is desirable because the identity and population of undesirable bonds in a CVD oxide film will vary according to the deposition conditions. By carefully controlling the energy and intensity of the components of UV radiation, undesirable bonds (such as Si—OH) within the CVD silicon oxide film can be disrupted, while formation of stable, desirable bonds within the film (such as network Si—O—Si) is enhanced.

Returning to FIG. 11, generation of radiation specifically tailored to densify a CVD $SiC_xO_y$ film may be accomplished by introducing a mixture of gases into bulb 1102, each gas emitting radiation of a characteristic wavelength upon excitation. For example, excited gaseous Xe generates UV radiation having a wavelength $\lambda=172$ nm. By comparison, excited gaseous Hg produces lower energy UV radiation having a longer wavelength $\lambda=243$ nm.

Excitation of a mixture of Xe and Hg gas within bulb 1102 by filament 1104 thus produces UV radiation of two discrete wavelengths $\lambda=172$ nm and $\lambda=243$ nm. By varying the relative concentration of these gases, the intensity of output from radiation source 1100 can be varied to minimize the total exposure time by matching the photon distribution with the chemical bonding structure.

Although the present invention has been described above in connection with specific preferred embodiments, it must be understood that the invention as claimed should not be unduly limited to these embodiments. Various modifications and alterations in the disclosed structures, methods, and processes will be apparent to those skilled in the art without departing from the scope of the present invention.

For example, while the present invention is described above in connection with densifying a carbon-doped silicon oxide film formed by the reaction between TMS and ozone, the present invention is not limited to densification of such a film. The carbon-doped silicon oxide film resulting from reaction between a variety of silicon supplying material containing at least one silicon carbon bond and an oxygen supplying material well known to those of skill in the art could also be densified utilizing ultraviolet light in accordance with one embodiment of the present invention.

Moreover, while the present invention is described above in connection with UV exposure of wafers loaded into a separate irradiation chamber, the present invention is not limited to such a configuration. Wafers bearing a freshly deposited silicon oxide coating could be exposed to UV radiation directly inside the CVD processing chamber itself, and the densification method and apparatus would remain within the scope of the present invention. In such an alternative embodiment, the UV source could be protected from the CVD reaction by a shield or by introducing the UV source into the chamber subsequent to the flow of process gases. Moreover, the controller of the processing system could also control the ultraviolet radiation source, and could include memory coupled to said controller comprising a computer-readable medium having a computer-readable program embodied therein for directing operation of said controller, said computer readable program including instructions to control said ultraviolet radiation source to irradiate at least one of the process chamber and the substrate holder.

In addition, while one embodiment of the present invention describes a radiation source featuring a mixture of excitable gases determined by an inlet flow from a plurality of gas sources, this is not required by the present invention. A pre-packaged radiation source containing a fixed mixture of excitable gases, whose stimulation is calculated to produce radiation optimized to densify a carbon-doped silicon oxide film, would also fall within the scope of the present invention.

Finally, while the present invention is described above in connection with densifyng a carbon-doped silicon oxide film already formed on a wafer, the present invention is not limited to this type of method. Ultraviolet light could be applied in-situ during (rather than subsequent to) a CVD reaction producing silicon oxide, and the method would still fall within the scope of the present invention. In such an alternative method, application of radiation into the deposition chamber during the deposition reaction would disrupt undesirable bonds as they are formed, thereby enhancing the stability of the film ultimately deposited.

One embodiment of a substrate processing system in accordance with such an approach comprises a housing defining a process chamber, and a substrate holder adapted to hold a substrate during substrate processing. A gas delivery system is configured to introduce gases into said process chamber, and an ultraviolet radiation source introduces ultraviolet radiation into said process chamber. A controller controls the gas delivery system and the ultraviolet radiation source, with a memory coupled to said controller comprising a computer-readable medium having a computer-readable program embodied therein for directing operation of said controller. The computer readable program includes instructions to control said gas delivery system to flow a process gas comprising a silicon supplying gas and an oxygen supplying gas into the substrate processing chamber, and also includes instructions to control said ultraviolet radiation source to irradiate at least one of the process chamber and the substrate holder.

Having fully described several embodiments of the present invention, many other equivalent or alternative apparatuses and methods of densifying a CVD oxide layer according to the present invention will be apparent to those skilled in the art. These alternatives and equivalents are intended to be included within the scope of the present invention.

What is claimed is:

1. An ultraviolet radiation source comprising:
   a first gas supply in fluid communication with a bulb through a first mass flow controller, the first mass flow controller operable to regulate a flow of a first gas into the bulb;

a second gas supply in fluid communication with the bulb through a second mass flow controller, the second mass flow controller operable to regulate a flow of a second gas into the bulb;

a pump operable to evacuate the bulb through an outlet; and a filament disposed within the bulb and in electrical communication with a power supply, such that a current flowed through the filament causes the first gas and the second gas to become excited and to emit ultraviolet radiation.

2. An ultraviolet radiation source of claim 1 wherein:

the first gas flow comprises a flow of Xe gas; and the second gas flow comprises a flow of Hg gas.

3. An ultraviolet radiation source of claim 1 wherein:

the first gas flow comprises a flow of a gas selected from the group consisting of Xenon, Mercury, Deuterium, and $KrCl_2$; and the second gas flow comprises a flow of gas different from the first gas flow, the second gas flow selected from the group consisting of Xenon, Mercury, Deuterium, and $KrCl_2$.

4. An ultraviolet radiation source comprising:

a first gas present in an airtight bulb, the first gas excitable to emit radiation having a first wavelength;

a first controller configured to control a concentration of the first gas in the airtight bulb;

a second gas present in the airtight bulb, the second gas excitable to emit radiation having a second wavelength;

a second controller configured to control a concentration of the second gas in the airtight bulb;

a filament disposed within the bulb and in electrical communication with a power supply, such that a current flowed through the filament causes the first gas and the second gas to become excited and to emit ultraviolet radiation of the first and second wavelengths, intensities of the ultraviolet radiation of the first and second wavelengths correlating to concentrations of the first and second gases in the airtight bulb.

5. An ultraviolet radiation source of claim 4 wherein:

the first gas comprises Xe gas; and the second gas comprises Hg gas.

6. An ultraviolet radiation source of claim 4 wherein:

the first gas comprises a gas selected from the group consisting of Xenon, Mercury, Deuterium, and $KrCl_2$; and the second gas comprises a gas different from the first gas and selected from the group consisting of Xenon, Mercury, Deuterium, and $KrCl_2$.

* * * * *